United States Patent [19]
Lemelson et al.

[11] Patent Number: 5,714,202
[45] Date of Patent: Feb. 3, 1998

[54] SYNTHETIC DIAMOND OVERLAYS FOR GAS TURBINE ENGINE PARTS HAVING THERMAL BARRIER COATINGS

[76] Inventors: Jerome H. Lemelson, 868 Tyler Way, Incline Village, Nev. 89540; James G. Conley, 433 Jefferson Ave., Glencoe, Ill. 60022

[21] Appl. No.: 486,975

[22] Filed: Jun. 7, 1995

[51] Int. Cl.$^6$ .................... C23C 16/26; C23C 4/08; B05D 3/06
[52] U.S. Cl. ............ 427/249; 427/577; 427/566; 427/456; 427/419.2; 427/404; 427/124
[58] Field of Search ................... 427/249, 577, 427/404, 419.2, 456, 124, 566; 428/408

[56] References Cited

U.S. PATENT DOCUMENTS

| | | |
|---|---|---|
| Re. 33,876 | 4/1992 | Goward et al. |
| 2,411,867 | 12/1946 | Brenner. |
| 2,793,282 | 5/1957 | Steigerwald. |
| 2,861,166 | 11/1958 | Cargill, Jr. |
| 2,947,610 | 8/1960 | Hall. |
| 2,968,723 | 1/1961 | Steigerwald. |
| 3,141,746 | 7/1964 | De Lai. |
| 3,207,582 | 9/1965 | Inoue. |
| 3,346,458 | 10/1967 | Schmidt. |
| 3,702,573 | 11/1972 | Nemeth. |
| 3,714,332 | 1/1973 | Rasquin et al. |
| 3,913,280 | 10/1975 | Hall. |
| 3,916,506 | 11/1975 | Wolf. |
| 3,929,432 | 12/1975 | Caveney. |
| 3,959,557 | 5/1976 | Berry. |
| 4,054,426 | 10/1977 | White. |
| 4,084,942 | 4/1978 | Villalobos. |
| 4,321,311 | 3/1982 | Strangman. |
| 4,385,880 | 5/1983 | Lemelson. |
| 4,401,097 | 8/1983 | Simonds et al. |
| 4,405,659 | 9/1983 | Strangman. |
| 4,434,188 | 2/1984 | Kamo et al. |
| 4,490,229 | 12/1984 | Mirtich et al. |
| 4,504,519 | 3/1985 | Zelez. |
| 4,554,208 | 11/1985 | MacIver et al. |
| 4,594,294 | 6/1986 | Eichen et al. |
| 4,663,183 | 5/1987 | Ovshinsky et al. |
| 4,707,384 | 11/1987 | Schachner et al. |
| 4,725,345 | 2/1988 | Sakamoto et al. |
| 4,734,339 | 3/1988 | Schachner et al. |
| 4,764,434 | 8/1988 | Aronsson et al. |
| 4,816,286 | 3/1989 | Hirose. |
| 4,849,199 | 7/1989 | Pinneo. |
| 4,859,493 | 8/1989 | Lemelson. |
| 4,874,596 | 10/1989 | Lemelson. |
| 4,882,138 | 11/1989 | Pinneo. |
| 4,904,542 | 2/1990 | Mroczkowski. |

(List continued on next page.)

FOREIGN PATENT DOCUMENTS

| | | |
|---|---|---|
| 57-106513 | 7/1982 | Japan. |
| 60-195094 | 10/1985 | Japan. |
| 61-106494 | 5/1986 | Japan. |
| 61-124573 | 6/1986 | Japan. |
| 62-72921 | 4/1987 | Japan. |
| 62-196371 | 8/1987 | Japan. |

OTHER PUBLICATIONS

Article: "Laser Method for Synthesis and Processing of Continuous Diamond Films on Nondiamond Substrates", Narayan et al., Apr.19, 1991 (*Science*, vol. 252).

Article: "Growth Mechanisms of Diamond-Like Films Formed by Laser Ablation of Graphite," Bourdon et al., Aug. 20, 1990 (Publication) (*Applied Surface Science*).

(List continued on next page.)

*Primary Examiner*—Roy V. King
*Attorney, Agent, or Firm*—Niro, Scavone, Haller & Niro

[57] ABSTRACT

This invention discloses methods of making new and improved multi-layer coatings for gas turbine engine parts that are exposed to elevated temperatures, such as blades and vanes in the high pressure compressor and turbine of multi-stage aircraft engines, by applying a diamond film over columnar thermal barrier coatings such as yttria-stabilized zirconia, improving the erosion resistance of the thermal barrier coating.

5 Claims, 1 Drawing Sheet

U.S. PATENT DOCUMENTS

| | | |
|---|---|---|
| 4,960,643 | 10/1990 | Lemelson . |
| 4,974,498 | 12/1990 | Lemelson . |
| 5,021,628 | 6/1991 | Lemelson . |
| 5,040,501 | 8/1991 | Lemelson . |
| 5,067,826 | 11/1991 | Lemelson . |
| 5,087,477 | 2/1992 | Giggins, Jr. et al. . |
| 5,096,352 | 3/1992 | Lemelson . |
| 5,131,941 | 7/1992 | Lemelson . |
| 5,190,823 | 3/1993 | Anthony et al. . |
| 5,224,969 | 7/1993 | Chen et al. . |
| 5,346,719 | 9/1994 | Zarnoch et al. . |
| 5,366,556 | 11/1994 | Prince et al. . |
| 5,382,293 | 1/1995 | Kawarada et al. . |
| 5,391,407 | 2/1995 | Dearnaley . |
| 5,391,409 | 2/1995 | Shibata et al. . |
| 5,403,399 | 4/1995 | Kurihara et al. . |

OTHER PUBLICATIONS

Article: "The Bonding of Protective Films of Amorphic Diamond to Titanium", Collins et al., Dec. 16, 1991 (Publication), (*Journal of Applied Physics*, vol. 71, No. 7).

Article: "Low Pressure, Metastable Growth of Diamond and 'Diamond–Like' Phases," John C. Angus & Cliff C. Hayman, Aug. 19, 1988, *Science*, p. 913.

Pierson, "Handbook of Chemical Vapor Deposition (CVD) Principles, Technology and Application", Noyes Publications (1992), p. 356.

Baldazhev et al, "Diamond–Treated Plasma Sprayed MGAIY Coatings," (Sci. Ind. Coop. Mach. Technol., Moscow, USSR). DVS. Ber., 130 (Therm. Spritzkonf., 1990), pp. 197–199 (English) 1990.

SYNTHETIC DIAMOND OVERLAYS FOR GAS TURBINE ENGINE PARTS HAVING THERMAL BARRIER COATINGS

BACKGROUND OF THE INVENTION

1. Field of the Invention

This invention relates to methods of making new and improved multi-layer coatings for gas turbine engine parts that are exposed to elevated temperatures, such as blades and vanes in the high pressure compressor and turbine of multi-stage aircraft engines. The invention comprises application of a diamond film over thermal barrier coatings such as yttria-stabilized zirconia, improving the erosion resistance of the thermal barrier coating.

2. Background of the Invention

This invention relates to improving the erosion resistance of thermal barrier coatings used on certain gas turbine engine parts such as combustion chambers, transition ducts, afterburner liners, blades and vanes. Such parts are exposed to very high temperatures during engine operation and to thermal cycling when the engine is started up or shut down. Yet, still higher gas temperatures lead to increased thermal efficiency of the turbine engines themselves. There is a need, therefore, for further improvements in thermal barrier coatings for critical parts of such engines.

It is known to protect critical gas turbine engine parts with thermal barrier coatings made of a variety of low thermal conductivity refractories. U.S. Pat. No. Re. 33,876 (Goward, et al.), for example, discloses plasma spray coatings of refractories comprising zirconia, preferably stabilized in its cubic form by addition of Yttria, $La_2O_3$, calcium oxide or magnesium oxide. Such coatings typically are desired to be applied over nickel- or cobalt-based superalloy such as Hastelloy X, TD-nickel or Haynes 188. Because of mismatch between the coefficients of thermal expansion of the refractory ceramic coating and the alloy, however, an intermediate bond coating of alloys of the base metal with Cr, Al and Y (termed MCrAlY bond coatings) are used to help reduce spalling of the refractory. Typically a very thin surface layer of such MCrAlY bond coatings is in oxidized form. In addition, the concentration of stabilized zirconia in the refractory coating may be graded continuously, from zero adjacent the MCrAlY bond coat up to 100% at the external surface of the refractory. The foregoing technique, however, produces discrete metal alloy particles within the refractory oxide coating. In use, oxidation of the metal particles can increase their size, causing unacceptable stress in the refractory coating.

Another proposed solution to the problem of thermal expansion coefficient mismatch between the superalloy and the refractory coating is to segment the refractory coating in some fashion, for example by means of bonding tiles or other discrete shapes of refractory to the metal. In this approach, which is generally applied to large articles, the segments are not bonded to each other, and the gaps between the tiles permit accommodation of the thermal expansion of the metal. Such an approach (the application of individual segments) would not be practical in the case of gas turbine engine components in which extreme operating conditions will be encountered and which a multiplicity of small complex parts must be coated at a reasonable cost. Additionally, in the use of such a segmented ceramic approach, there still remains the problem of obtaining a good metal-ceramic bond.

Still another approach to the application of thermal barrier coatings to gas turbine engine parts has been to use physical vapor deposition, for example electron beam physical vapor deposition (EBPVD) (a technique described in U.S. Pat. No. 5,087,477) to create a ceramic coating is comprised of many individual columnar segments which are firmly bonded to the article to be protected, but not to each other. By providing gaps between the columnar segments, such EBPVD refractory coatings are said to allow the metallic substrate to expand during engine operation without causing damaging stresses in the ceramic. Such columnar refractory coatings are disclosed in U.S. Pat. No. 4,321,311, which also suggests applying them over an MCrAlY bond coat having a thin oxidized surface. Preferable refractory ceramics for EBPVD application with columnar morphology include zirconia (preferably stabilized with a material such as yttria), alumina, ceria, mullite, zircon, silica, silicon nitride, hafnia, and certain zirconates, borides and nitrides. The columns are said to be about 0.1 mils in cross-section, with thicknesses of 1 to 50 mils. The EBPVD coating process is preferably carried out in such a way as to avoid reduction of the ceramic; a stoichiometric oxide coating (not deficient in oxygen) is desired. One advantage of these columnar coatings is that they are pure refractory without metal alloy inclusions.

The columnar morphology used by other workers, however, has drawbacks. Among them is wear caused by the direct exposure of the refractory to the extremely hot and erosive gas present during gas turbine engine operation. Spalling may be reduced by the ability of the individual micro-columns of refractory to flex relative to each other without cracking, but the columns remain exposed to erosion due to particulates in the surrounding air or combustion gas.

Diamond, diamond-like carbon and diamond-like hydrocarbon coatings have been employed both to provide hard faces on engineered materials and as erosion-resistant coatings on articles made from such materials. Typically such diamond films and/or particles are applied using some form of chemical vapor deposition (CVD) process. The high thermal conductivity of diamond, however, has resulted in its being regarded in the past as unsuited for applications requiring thermal insulation, as in coating internal parts of gas turbine engines.

SUMMARY OF THE INVENTION

Figure 1:
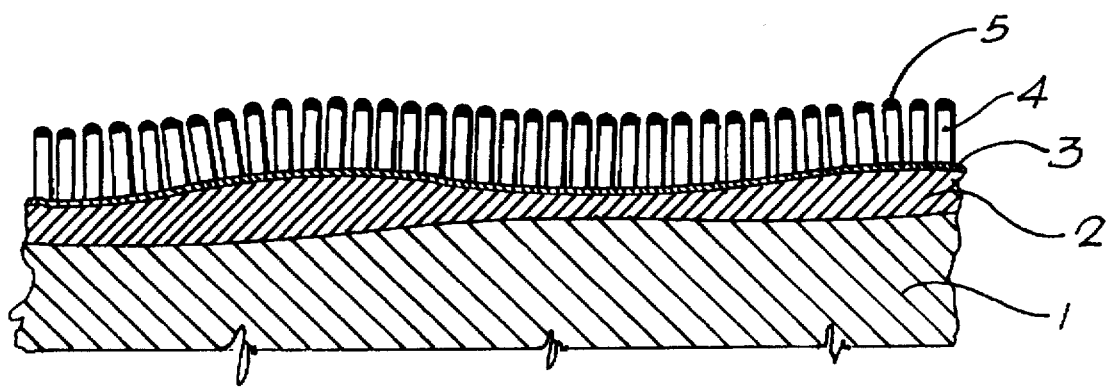
FIG. 1 is a cross-sectional drawing of a part to which the multi-layer coating of this invention has been applied.

We find that thin diamond coatings can be applied over columnar or graded refractories such as are conventionally used for thermal insulation of gas turbine engine parts, thus dramatically increasing the erosion resistance and life of such coatings without materially affecting their ability to provide thermal insulation.

Accordingly, it is an object of this invention to provide composite engineered coatings especially suited for use in coating metal parts that are exposed to high temperatures and/or thermal cycling as well as erosive wear, in which the outermost layer of such coatings comprises diamond, diamond-like carbon or diamond-like hydrocarbon.

It is a further object of this invention to provide composite engineered coatings especially suited for use in coating nickel- or cobalt-based superalloy parts of gas turbine engines that are exposed to high temperatures and/or thermal cycling as well as erosive wear, in which the outermost layer of such coatings comprises diamond, diamond-like carbon or diamond-like hydrocarbon.

It is a further object of this invention to provide such coatings comprising, in order: an optional MCrAlY bond coat; a cubic stabilized refractory coating having a columnar morphology or a graded composition applied to the bond coat, and a diamond film applied to the columnar stabilized refractory coating.

It is a further object of this invention to provide a method for producing such coatings comprising application of the optional MCrAlY bond coat by plasma spray; growing the columnar refractory coating by EBPVD and application of the diamond film by CVD.

It is still another object of this invention to provide an erosion resistant, thermal insulating coating of the types described, which further comprises a lubricating layer of chromium on the diamond film.

It is a further object of this invention to provide articles of manufacture having such coatings, including gas turbine engine combustion chambers, transition ducts, afterburner liners, blades and vanes, as well as other articles in which an erosion resistant, thermally insulating coating is desired.

Further objects of this invention will be apparent to those skilled in the arts to which it pertains from the following detailed description.

DETAILED DESCRIPTION OF THE INVENTION

To manufacture diamond-coated articles using this embodiment of our invention, an article such as a gas turbine engine blade is first coated with a columnar ceramic thermal insulating layer using EBPVD or other suitable techniques known to those skilled in the art and disclosed, for example, in U.S. Pat. Nos. 4,321,311; No. 4,401,097; No. 4,405,659 and No. 5,087,477, the disclosures of which are specifically incorporated by reference herein. The use of an intermediate MCrAlY bond coat between the metal substrate and the columnar ceramic refractory layer is optional.

Next, a diamond film, having a thickness of at least about 0.5 micro-meters and preferably at least about 1 micrometer, is applied to the columnar ceramic refractory layer using CVD or other suitable technique. Suitable CVD processes generally use thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful for CVD include C1–C4 saturated hydrocarbons such as methane, ethane, propane and butane; C1–C4 unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (see U.S. Pat. No. 4,816,286). The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or a layer-like agglomerates of crystallites substantially free from intercrystalline adhesion binder.

Such CVD processes are known to those skilled in the art, and ordinarily use some form of energy (for example, microwave radiation, as in U.S. Pat. No. 4,859,493 and in U.S. Pat. No. 4,434,188) to pyrolyze hydrocarbon gases such as methane at concentrations of about 1% to 2% in a low pressure (about 10 torr) hydrogen atmosphere, causing deposition of diamond or "diamond-like carbon" (a—C) or "diamond-like hydrocarbon" (a—C:H) particles or film on a nearby substrate. (Diamond and "diamond-like carbon" (a—C) coatings have an atomic hydrogen fraction of zero; for "diamond-like hydrocarbon" (a—C:H) coatings that fraction ranges from about 0.15 to about 0.6. Diamond coatings have atom number densities around 0.29 gram-atoms per cubic centimeter; "diamond-like carbon" (a—C) and "diamond-like hydrocarbon" (a—C:H) materials are characterized by atom number densities above 0.19 gram-atoms per cc.) It is also possible to assist the CVD process using a variety of techniques including (1) pyrolysis by a hot tungsten filament intended to generate atomic hydrogen near the substrate (HFCVD); (2) supplying electrons by negatively biasing the filament as in electron-assisted chemical vapor deposition (EACVD); (3) creating a plasma using microwave energy or RF energy (PACVD; see U.S. Pat. Nos. 4,504,519 and 5,382,293); (4) using an argon ion beam to decompose the hydrocarbon feedstock, as in U.S. Pat. No. 4,490,229 and (5) using direct-current electrical discharge methods. See, generally, John C. Angus and Cliff C. Hayman, "Low-Pressure, Metastable Growth of Diamond and 'Diamondlike' Phases," *Science*, Aug. 19, 1988, at p. 913. The disclosures of the U.S. patents cited in this paragraph are incorporated by reference herein.

The ion beam deposition method typically involves producing carbon ions by heating a filament and accelerating carbon ions to selected energies for deposit on a substrate in a high vacuum environment. Ion beam systems use differential pumping and mass separation techniques to reduce the level of impurities in the carbon ion flow to the growing film.

The chemical vapor deposition and plasma enhanced chemical vapor deposition methods are similar in operation. Both methods use the dissociation of organic vapors (such as $CH_3OH$, $C_2H_2$, and $CH_3OHCH_3$) to produce both carbon ions and neutral atoms of carbon for deposit on a substrate. Plasma enhanced methods are described in U.S. Pat. Nos. 5,382,293 and No. 5,403,399.

Where CVD is used to deposit the diamond layer, and an MCrAlY bond coat between the substrate and the ceramic thermal barrier layer is used as well (the preferred embodiment), the resulting structure appears schematically in FIG. 1. This cross-sectional view illustrates how the substrate material 1 (typically a nickel- or cobalt-based superalloy) is coated with an MCrAlY layer 2. This MCrAlY layer preferably is 1 to 10 mils in thickness and may have a composition similar to 18% chromium, 23% cobalt, 12.5% aluminum, 0.3% yttrium, balance nickel. It may be applied by plasma spray. Preferably it is polished to produce a polished outer surface 3. On this surface 3 there is formed an adherent alumina layer 4. A columnar ceramic layer 5 (preferably yttria-stabilized zirconia) adheres to the alumina layer 4. Diamond coating 6, having been applied by CVD, covers the columnar ceramic layer 5.

The result is a thermal barrier coating having the desirable thermal properties of the zirconia or similar refractory, coupled with the erosion resistance of diamond film 6. Optionally, the wear properties of diamond film 6 can be further improved by means of a chromium layer, which can be applied as described in U.S. Pat. Nos. 4,960,643; No. 5,346,719 and No. 5,224,969.

It will be apparent to those of ordinary skill in the art that many changes and modifications could be made while remaining within the scope of our invention. We intend to cover all such equivalent articles of manufacture and processing methods, and to limit our invention only as specifically delineated in the following claims.

We claim:

1. A process for applying a wear-resistant and erosion-resistant diamond coating to a thermally insulated substrate comprising:
   a. providing a superalloy substrate with a clean surface;
   b. applying a thin adherent layer of MCrAlY to the clean surface;
   c. applying a thermally insulating columnar ceramic coating to said MCrAlY layer; and
   d. applying a thin diamond coating to said ceramic coating.

2. The process of claim 1 wherein said MCrAlY layer is applied by plasma spraying.

3. The process of claim 1 wherein said thermally insulating columnar ceramic coating is applied by EBPVD.

4. The process of claim 1 wherein said diamond coating is applied by CVD.

5. The process of claim 1 further comprising applying a chromium coating to said diamond coating.

* * * * *